United States Patent
Hummler

(10) Patent No.: US 6,573,136 B1
(45) Date of Patent: Jun. 3, 2003

(54) ISOLATING A VERTICAL GATE CONTACT STRUCTURE

(75) Inventor: Klaus Hummler, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/158,982

(22) Filed: May 30, 2002

(51) Int. Cl.$^7$ .......................................... H01L 21/8242
(52) U.S. Cl. ..................... 438/242; 438/244; 438/245; 438/387; 438/388; 438/391; 438/589
(58) Field of Search ................... 438/585–589, 438/592, 595, 242, 244–5, 387, 388, 391

(56) References Cited

U.S. PATENT DOCUMENTS

| | | | | |
|---|---|---|---|---|
| 5,244,824 A | * | 9/1993 | Sivan | 437/52 |
| 5,250,450 A | * | 10/1993 | Lee et al. | 437/40 |
| 5,399,516 A | * | 3/1995 | Bergendahl et al. | 437/43 |
| 5,512,517 A | * | 4/1996 | Bryant | 437/203 |
| 5,656,544 A | * | 8/1997 | Bergendahl et al. | 438/386 |
| 5,677,219 A | * | 10/1997 | Mazureet et al. | 437/52 |
| 6,207,494 B1 | * | 3/2001 | Graimann et al. | 438/248 |
| 6,239,465 B1 | * | 5/2001 | Nakagawa | 257/331 |
| 6,391,721 B2 | * | 5/2002 | Nakagawa | 438/259 |
| 6,432,774 B2 | * | 8/2002 | Heo et al. | 438/589 |
| 6,472,263 B1 | * | 10/2002 | Noble | 438/237 |
| 2001/0044188 A1 | * | 11/2001 | Heo et al. | 438/268 |
| 2001/0044189 A1 | * | 11/2001 | Heo et al. | 438/268 |
| 2001/0044190 A1 | * | 11/2001 | Heo et al. | 438/270 |

* cited by examiner

*Primary Examiner*—John F. Niebling
*Assistant Examiner*—Lynne Gurley
(74) *Attorney, Agent, or Firm*—Jackson Walker L.L.P.

(57) ABSTRACT

The present invention provides an easy post GC etch treatment that can remove vertical GC residues without affecting the support devices while ensuring a robust GC to vertical gate contact in all alignment scenarios. The conductive vertical gate contact of the present invention, in conjunction with any DT top isolation approach, allows for an aggressive post GC etch treatment to avoid gate to bit line shorts without compromising the contact between the GC and the vertical gate.

19 Claims, 6 Drawing Sheets

US 6,573,136 B1

ISOLATING A VERTICAL GATE CONTACT STRUCTURE

FIELD OF THE INVENTION

The invention relates generally to the manufacture of integrated circuits and, more particularly, to the isolation of a vertical gate contact of a transistor structure.

BACKGROUND OF THE INVENTION

Semiconductor memories, such as dynamic random access memories (DRAMs), typically include memory cells. These memory cells include storage nodes which are formed within deep trenches etched into substrates of the semiconductor memory chip. The storage nodes are accessed using a transistor which allows a charge to be stored in the storage node or retrieves a charge from the storage node, depending on the desired action (i.e., read or write). The storage node must be sufficiently electrically isolated from the gate conductor.

One way to ensure sufficient electrical isolation of the storage node is to provide a top trench oxide layer over the storage node. The storage nodes typically include polysilicon material that partially fills the deep trench. During fabrication, the polysilicon leaves a recess remaining at the top of the trench. An oxide (silicon dioxide) is deposited over the surface of the semiconductor device. During the oxide deposition, oxide is formed over the polysilicon in the trench. Other portions of the deposited oxide are removed by planarizing the surface of the semiconductor device and by recessing the oxide to leave a 30–50 nm oxide layer at the bottom of the recess. This oxide layer is referred to as a trench top oxide or isolation.

In the case where vertical transistors are fabricated on the memory device, a buried strap portion of the storage node (i.e., the portion directly below the top trench oxide) must outdiffuse to connect to a vertical transistor channel which extends along a gate conductor in the deep trench above the top trench oxide. In this way, when the vertical transistor conducts, a connection is made between the storage node and a bit line. The channel must be electrically isolated from the gate conductor (GC). Therefore, an insulating layer is provided, typically an oxide layer formed by oxidizing single crystalline silicon within the deep trench and the channel.

In the vertical array device DRAM process, the GC etch is required to remove excess vertical gate material to avoid shorts between the word line and the bit line. FIG. 1 illustrates the problem with residues in the "traditional" vertical gate process. The GC etch is required to etch excess pedestal material out of a box that is formed by the edge of GC 130 (isolated from active area 150 by array top oxide 180), trench top nitride spacer 160 and the two (2) sides bordering on the isolation trench (IT) which is both in front of and behind the plane of FIG. 1. The weakest point is tip 170 of vertical gate pedestal 120, but includes GC 130 and vertical gate 110 because the conductive gate material can later short. Tip 170 is the weakest point because it has the least amount of SiN 140 on top of it. In this scenario, the bit line contact (not shown) is likely to short to vertical gate 110 because the GC etch may leave polysilicon residues on the sidewalls of the box. The residues can cause shorts to the bit line contact (CB). The bit line contacts will be etched later, to the left and right of the GC 130 line. This etch needs to contact active areas 150, which are silicon (Si). It is an oxide etch that is selective to SiN. Therefore, it is important to have sufficient SiN 140 over all exposed material of GC 130, vertical gate pedestal 120 and vertical gate 110. This prevents the bit line contact (CB) etch from penetrating through to GC 130 and causing a short. Even more critical are the sides of vertical gate pedestal 120 bordering on the IT because these sidewalls are more vertical or even re-entrant and therefore more prone to GC residues after the highly anisotropic GC etch.

It is therefore desirable to enable an easy post GC etch treatment that can remove vertical GC residues without affecting the support devices, while ensuring a robust GC to vertical gate contact in all alignment scenarios.

The present invention provides an easy post GC etch treatment that can remove vertical GC residues without affecting the support devices while ensuring a robust GC to vertical gate contact in all alignment scenarios. The conductive vertical gate contact of the present invention, in conjunction with any deep trench top isolation approach, allows for an aggressive post GC etch treatment to avoid gate to bit line shorts without compromising the contact between the GC and the vertical gate.

DETAILED DESCRIPTION

While the making and using of various embodiments of the present invention are discussed herein in terms of a U-shaped contact used in conjunction with a deep trench (DT) top replacement spacer, it should be appreciated that the present invention provides many inventive concepts that can be embodied in a wide variety of configurations and contexts. The specific embodiments discussed herein are merely illustrative of specific ways to make and use the invention, and are not meant to limit the scope of the invention.

The present invention provides an easy post GC etch treatment that can remove vertical GC residues without affecting the support devices while ensuring a robust GC to vertical gate contact in all alignment scenarios. The conductive vertical gate contact of the present invention, in conjunction with any DT top isolation approach, allows for an aggressive post GC etch treatment to avoid gate to bit line shorts without compromising the contact between the GC and the vertical gate.

Figure 3:
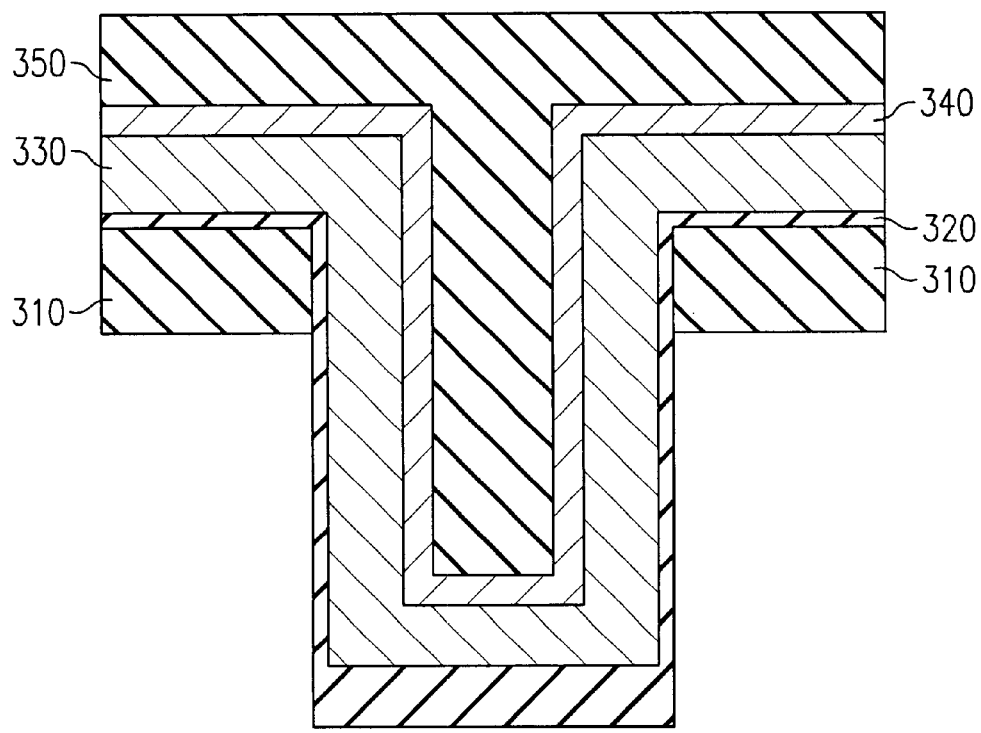
FIG. 3 illustrates an exemplary initial material deposition to form a vertical gate contact in accordance with an exemplary embodiment of the present invention.
Figure 2:
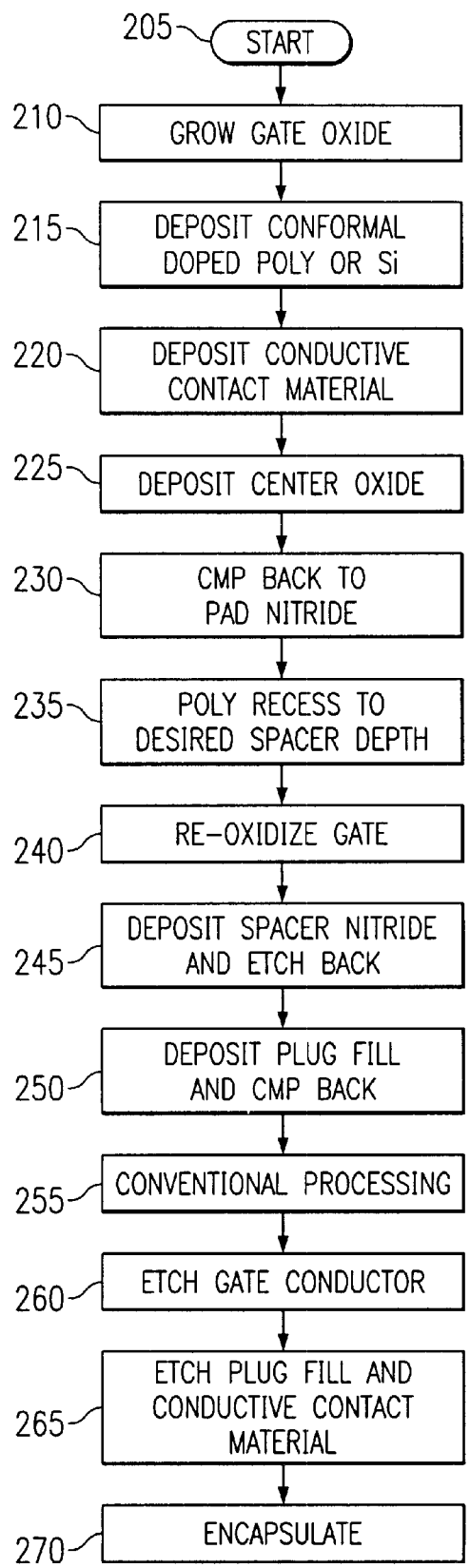
FIG. 2 is a flow chart of formation steps for a vertical gate contact in accordance with an exemplary embodiment of the present invention.

FIG. 2 is a flow chart of formation steps for a vertical gate contact in accordance with an exemplary embodiment of the present invention. The steps of FIG. 2 are illustrated in FIGS. 3–11. The process for forming a vertical gate contact in accordance with an exemplary embodiment of the present invention starts in block 205. Gate oxide is grown in a substrate trench in block 210. In FIG. 3, pad nitride 310 of the substrate is shown covered by gate oxide 320, which also coats the trench (evidenced by the shape of gate oxide 320). The next step, block 215, is the deposition of conformal doped polysilicon to form the vertical gate. Vertical gate 330 is deposited on top of gate oxide 320. Next, in block 220, conductive contact material is deposited. An exemplary deposition configuration for the conductive contact material would be U-shaped. In FIG. 3, contact material 340 is shown on top of vertical gate 330. The thin layer of contact material 340 can be any conductive material other than doped poly (e.g., SiGe, TiSi, Ti, etc.). Then, center oxide is deposited in block 225 as illustrated by center oxide 350. Pad oxide, which is between pad nitride 310 and the substrate, undercut can lead to fill voids in center oxide 350. This undercut is created in earlier processing. If "bread loafing" occurs, it can lead to an even bigger fill void. "Bread loafing" takes place when material deposited on the tops of raised features overhangs those features, as a rising loaf of bread overhangs the edge of the pan. In extreme cases, overhang from adjacent features can "pinch-off" deposition into a trench or contact hole altogether, creating a void. This is only relevant for layers deposited after gate oxide 320 and can lead to a potential center void in center oxide 350.

Figure 4:
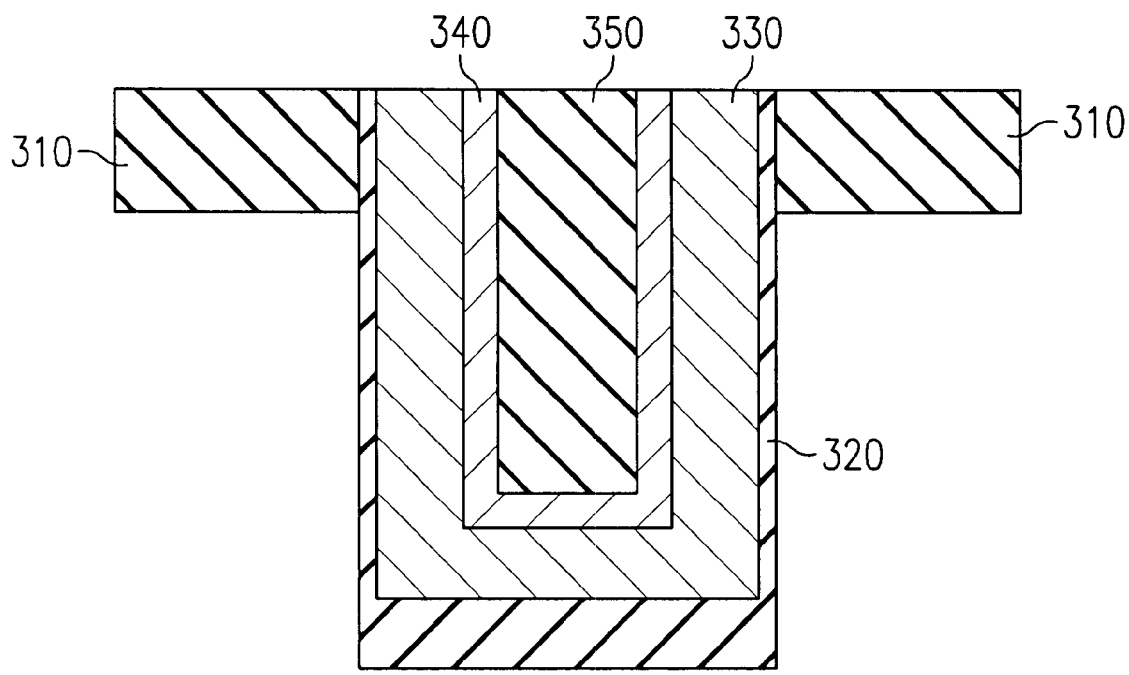
FIG. 4 illustrates FIG. 3 after chemical-mechanical polishing.
Figure 5:
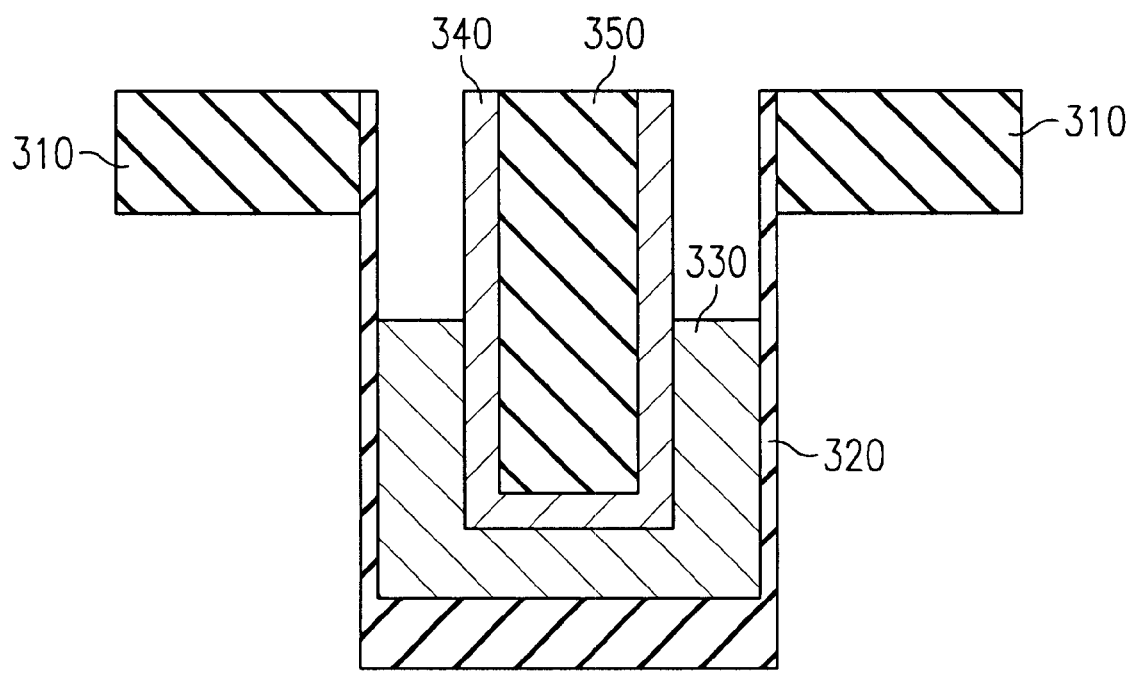
FIG. 5 illustrates FIG. 4 after poly recess to desired spacer depth.
Figure 6:
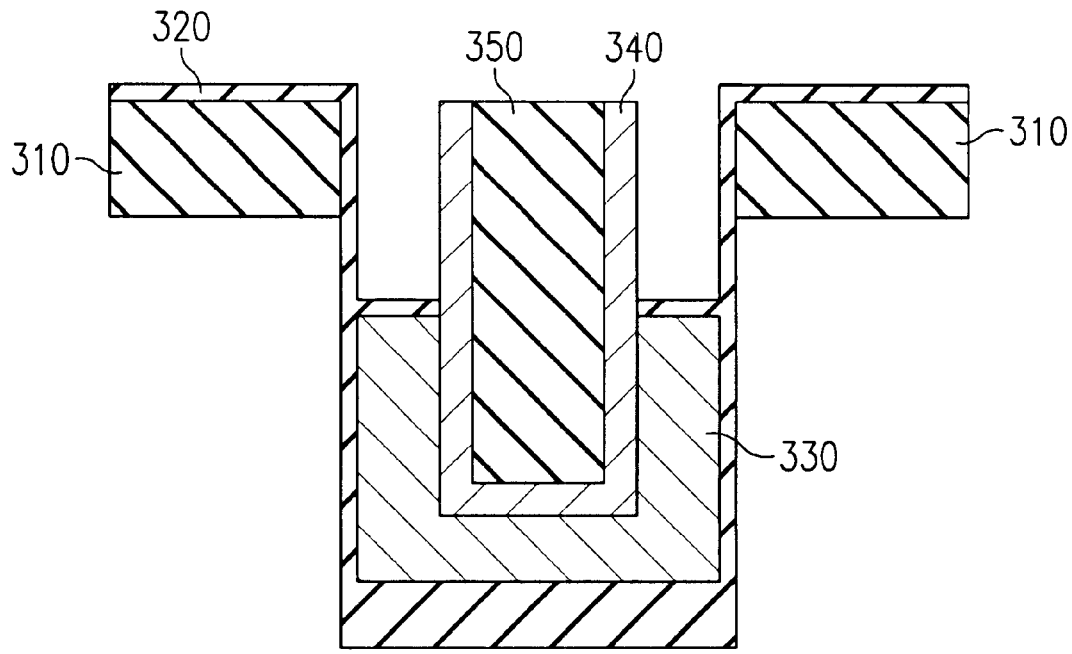
FIG. 6 illustrates FIG. 5 after gate re-oxidation.
Figure 7:
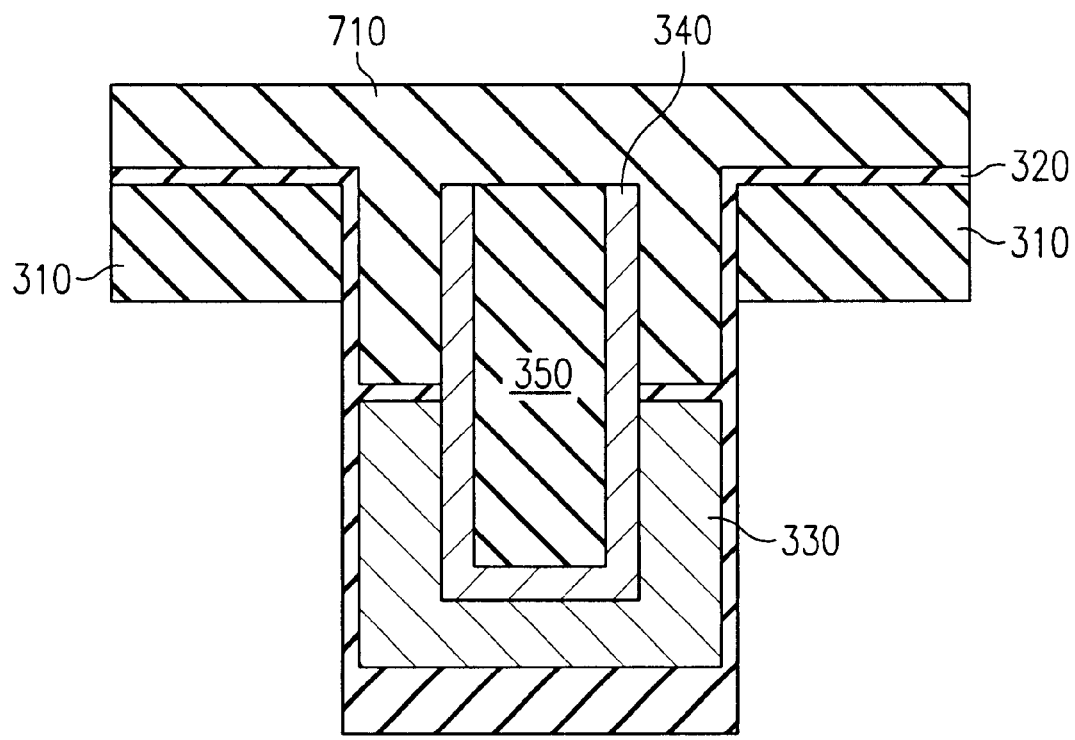
FIG. 7 illustrates FIG. 6 after spacer nitride deposition.
Figure 8:
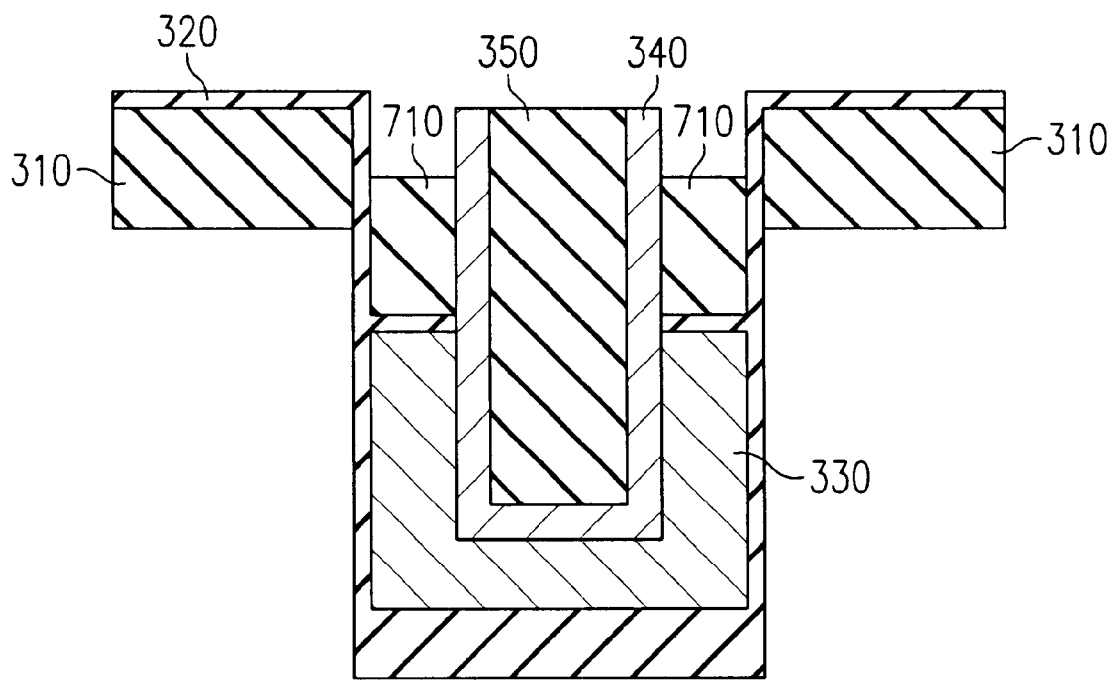
FIG. 8 illustrates FIG. 7 after etch-back.

Chemical-mechanical polishing (CMP) is performed in block 230 until pad nitride 310 is reached. FIG. 4 illustrates FIG. 3 after CMP. Alternatively, oxide and/or poly etch backs can be used. These etch backs can be, for example, a wet etch or a chemical downstream etch (CDE) or reactive ion etch (RIE). If recess tolerances are a problem, CMP should be used. An exemplary CMP "recipe" would take nitride loss into account because nitride loss during CMP can become an issue in DRAM processing. A poly recess to the desired spacer depth occurs in block 235. FIG. 5 illustrates FIG. 4 after poly recess of vertical gate 330 to the desired spacer depth. The spacer depth should be below the bottom of pad nitride 310. Then, vertical gate 330 is re-oxidized in block 240. FIG. 6 illustrates FIG. 5 after vertical gate 330 re-oxidation. Issues to be considered at this point in the process include the expansion and dopant redistribution in the poly during oxidation and the potential oxidation of contact material 340. Spacer nitride is deposited and an etch back is performed in block 245. FIG. 7 illustrates FIG. 6 after spacer nitride 710 is deposited. Spacer nitride can be deposited, for example, using a low pressure nitride (LP-nitride) deposition. FIG. 8 illustrates FIG. 7 after the etch back of block 245 is performed. This etch back may open voids in spacer nitride 710. In some embodiments, spacer nitride 710 is etched back to below the top of pad nitride 310 and above the bottom of pad nitride 310.

Figure 1:
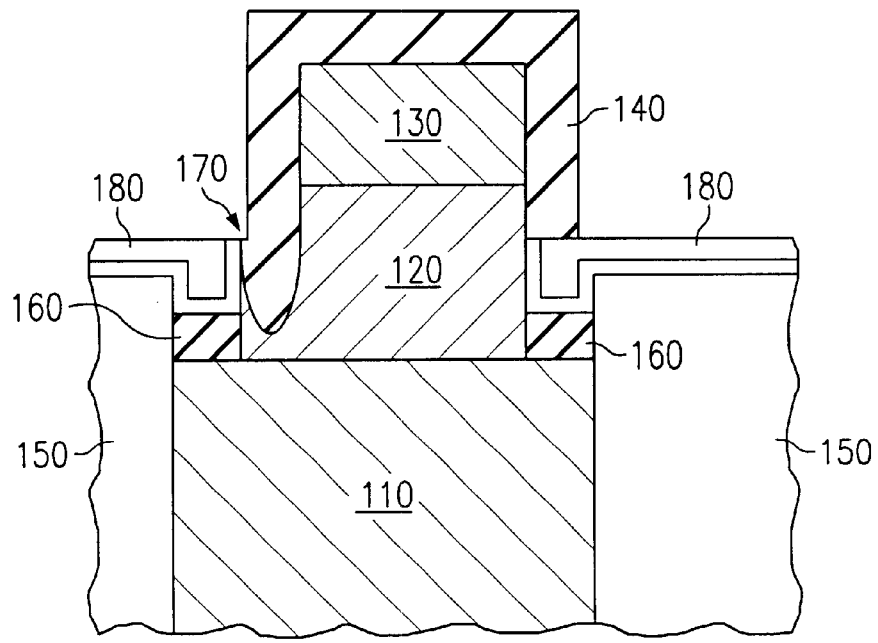
FIG. 1 illustrates the problem with residues in a vertical gate process in accordance with prior art.
Figure 9:
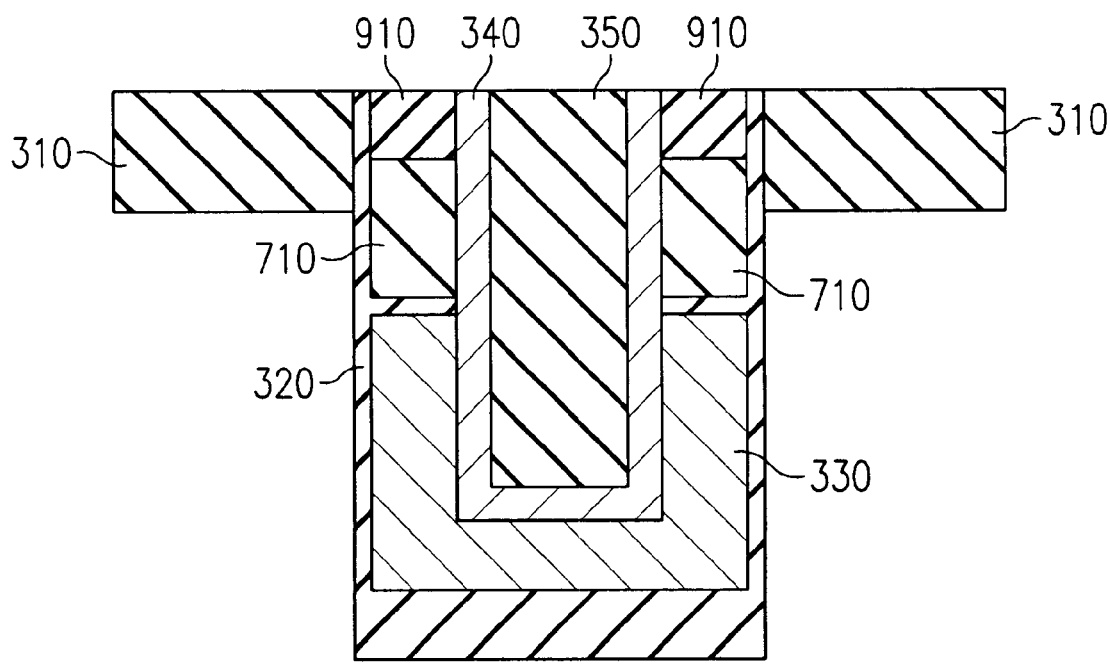
FIG. 9 illustrates FIG. 8 after plug fill and chemical-mechanical polishing.
Figure 10:
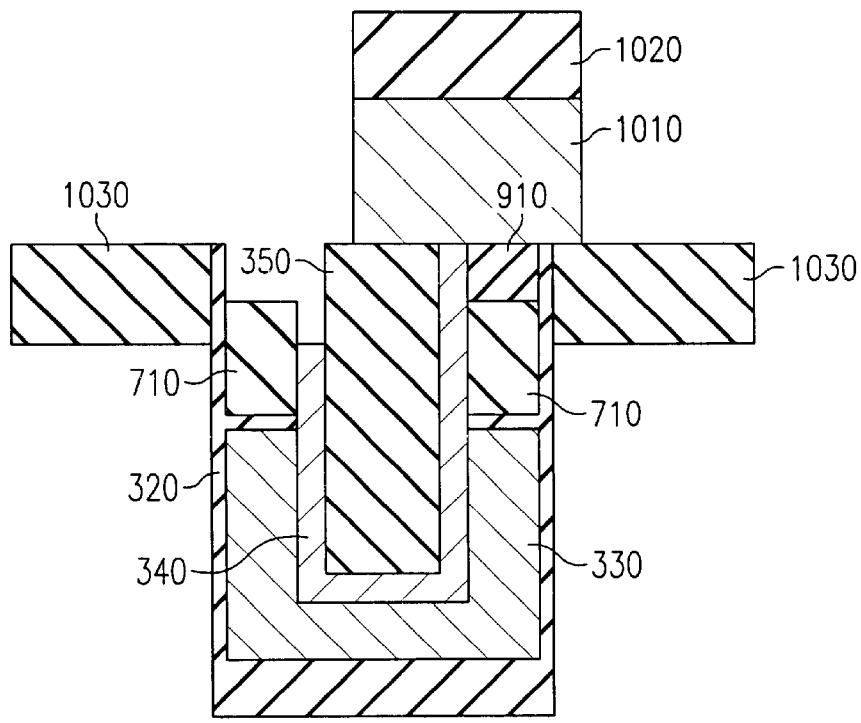
FIG. 10 illustrates FIG. 9 after etching.
Figure 11:
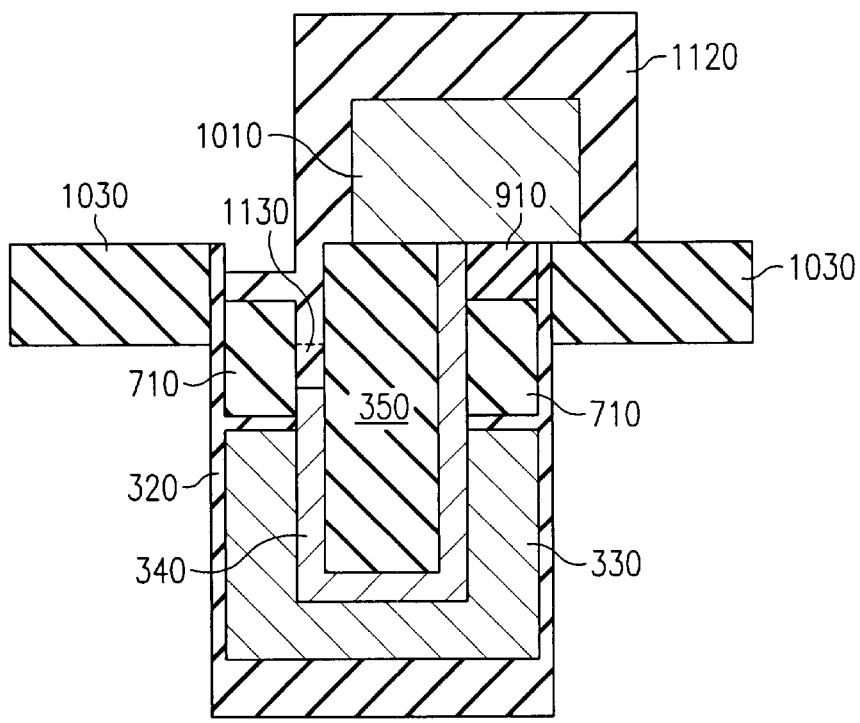
FIG. 11 illustrates FIG. 10 after gate conductor encapsulation.

The next step, block 250, is to deposit plug fill and perform another CMP. Alternatively, if the deposition thickness and etch rates can be adequately controlled, etch backs as described above can be used to replace all or part of the CMP. FIG. 9 illustrates FIG. 8 with plug fill 910. Plug fill 910 can be, for example, poly or oxide fill. There is no need to replace any lost center oxide 350. However, if desirable for the isolation trench (IT) etch, center oxide 350 can be replaced. At this point, block 255, conventional processing of the DRAM cell is performed, including forming IT trenches, performing implants and replacing pad nitride 310 with array top oxide 1030 (FIG. 10). Next, the gate conductor (GC) is etched in block 260. Another etch is performed in block 265. This etch will remove a portion of contact material 340 and, if plug fill 910 is, for example, poly silicon, the etch will also remove plug fill 910. In some embodiments, and depending on the material of plug fill 910 and etching, plug fill 910 and contact material 340 can be removed by separate etches. After the etch of GC 1010 (FIG. 10), the exposed portion of contact material 340 can be etched selective to oxide, nitride and GC 1010 poly. This means that the support devices and GC 1010 in the array are not affected by the post etch treatment (PET) since they are poly. A wet etch can be used to remove all material, even from overhanging sidewalls. If plug fill 910 is made of the same material as contact material 340, the requirements for the etch of GC 1010 are extremely relaxed because a PET wet etch will remove all excess material outside of GC 1010. FIG. 10 illustrates FIG. 9 after plug fill 910 has been removed and a portion of contact material 340 has been exposed by the etching of block 265. FIG. 10 also shows an exemplary alignment of gate conductor (GC) 1010 with encapsulation 1020. Finally, in block 270, the entire gate conductor is encapsulated and the recess resulting from the block 265 etch is filled with encapsulation using a conventional spacer process. FIG. 11 illustrates FIG. 10 with encapsulation 1020 expanded to encapsulation 1120, thereby surrounding GC 1010 on three (3) sides. No large overetch is required because encapsulation 1120 easily plugs the resulting recess and prevents the bit line contact (CB) from shorting to contact material 340. The affect of the PET on contact material 340 is shown as recess 1130. The contact from GC 1010 to vertical gate 330 is completely unaffected by the recess etch of contact material 340. The configuration of FIG. 11 forms a new structure functionally equivalent to that of FIG. 1.

Although exemplary embodiments of the present invention have been described in detail, it will be understood by those skilled in the art that various modifications can be made therein without departing from the spirit and scope of the invention as set forth in the appended claims.

What is claimed is:

1. A method for forming a vertical gate contact structure, the method comprising:

providing a substrate having a trench therein;

forming a first gate oxide conformal to said trench;

forming a vertical gate in said trench adjacent said first gate oxide;

forming a conductive contact in said trench adjacent said vertical gate;

depositing a plug material between and adjacent to said first gate oxide and said conductive contact;

providing a gate conductor adjacent said conductive contact so that said conductive contact electrically connects said gate conductor to said vertical gate;

etching away said plug material and etching away a portion of said conductive contact to form a recess; and depositing an encapsulation material that covers said gate conductor and fills said recess.

2. The method of claim 1 wherein said vertical gate is one of doped poly and silicon.

3. The method of claim 1 wherein said conductive contact is one of silicon germanium, titanium silicon, and titanium.

4. The method of claim 1 wherein said plug material is one of a poly fill, an oxide fill, and a conductive contact material.

5. The method of claim 1 wherein said etching away steps are performed simultaneously.

6. The method of claim 1 including etching said portion of said conductive contact selective to one of oxide, nitride and poly.

7. The method of claim 1 wherein said conductive contact is U-shaped and said portion thereof is a leg of said U.

8. The method of claim 1 wherein the vertical gate is conformal to the first gate oxide and U-shaped.

9. The method of claim 8 wherein the conductive contact is conformal to the vertical gate and U-shaped.

10. The method of claim 1 including recessing said vertical gate to approximately a first predetermined depth within said trench to create a pair of cavities, each of said cavities bordered along a bottom by said vertical gate, along a first wall by said first gate oxide, and along a second wall by said conductive contact.

11. The method of claim 10 including depositing a second gate oxide conformal to the bottom of each of said cavities, said second gate oxide contacting said first gate oxide and said conductive contact at the respective first and second walls of each of said cavities.

12. The method of claim 11 including depositing a spacer layer conformal to said first and second gate oxides and filling each of said cavities.

13. The method of claim 12 including etching said spacer layer to approximately a second predetermined depth between a top edge and a bottom edge of a trench top nitride layer on said substrate to create a pair of spacers, each of said spacers bordered along a bottom by said second gate oxide, along a first side by said first gate oxide and along a second side by said conductive contact.

14. The method of claim 13 including providing a spacer between and adjacent to the first gate oxide and the conductive contact, said depositing step including depositing said plug material on top of said spacer, said etching step including etching selective to said spacer.

15. A method for forming a vertical gate contact structure, comprising:

providing a substrate having a trench therein;

forming a gate oxide conformal to said trench;

forming a vertical gate in said trench adjacent said gate oxide;

forming in said trench a conductive contact adjacent said vertical gate and having first and second portions which are electrically common but separated from one another by a space;

filling said space with a fill material;

providing a gate conductor adjacent said conductive contact so that said conductive contact electrically connects said gate conductor to said vertical gate;

performing on said first portion of said conductive contact an etching operation that is selective to said fill material and forms a recess in said trench; and depositing an encapsulation material that covers said gate conductor and fills said recess.

16. The method of claim 15 wherein the vertical gate is conformal to the gate oxide and U-shaped.

17. The method of claim 16 wherein the conductive contact is conformal to the vertical gate and U-shaped.

18. The method of claim 15 wherein the conductive contact is U-shaped and said first and second portions are legs of said U.

19. The method of claim 15 wherein said fill material is an oxide and said etching operation includes etching the first portion of said conductive contact selective to said oxide.

* * * * *